(12) United States Patent
Fifield et al.

(10) Patent No.: US 7,466,582 B2
(45) Date of Patent: *Dec. 16, 2008

(54) VOLTAGE CONTROLLED STATIC RANDOM ACCESS MEMORY

(75) Inventors: John Atkinson Fifield, Underhill, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/763,687

(22) Filed: Jun. 15, 2007

(65) Prior Publication Data

US 2007/0236986 A1 Oct. 11, 2007

(51) Int. Cl.
*G11C 11/00* (2006.01)
(52) U.S. Cl. .............. 365/154; 365/189.07; 365/189.09
(58) Field of Classification Search ................. 365/154, 365/189.07, 189.09
See application file for complete search history.

(56) References Cited

U.S. PATENT DOCUMENTS

| 4,563,754 | A | 1/1986 | Aoyama et al. ............. 365/190 |
| 5,046,052 | A | 9/1991 | Miyaji et al. ................ 365/226 |
| 5,453,949 | A | 9/1995 | Wiedmann et al. .......... 365/156 |
| 5,642,315 | A | 6/1997 | Yamaguchi ............ 365/189.09 |
| 5,726,944 | A | 3/1998 | Pelley et al. |
| 6,144,606 | A | 11/2000 | Pan |
| 6,212,124 | B1 | 4/2001 | Noda ...................... 365/230.6 |
| 6,344,922 | B1 | 2/2002 | Grubb et al. |
| 6,434,040 | B1 | 8/2002 | Kim et al. .................. 365/154 |
| 6,483,739 | B2 * | 11/2002 | Houston ..................... 365/154 |
| 6,515,893 | B1 | 2/2003 | Bhavnagarwala ........... 365/154 |
| 6,611,451 | B1 | 8/2003 | Houston |
| 6,654,277 | B1 | 11/2003 | Hsu et al. ................... 365/154 |
| 6,728,130 | B1 * | 4/2004 | Afghahi et al. .............. 365/156 |
| 7,057,958 | B2 * | 6/2006 | So et al. ..................... 365/211 |
| 7,088,620 | B2 | 8/2006 | Kawai et al. |
| 7,120,061 | B2 | 10/2006 | Daga |
| 7,352,609 | B2 * | 4/2008 | Fifield et al. ................ 365/154 |
| 2004/0099885 | A1 | 5/2004 | Yeo et al. |
| 2007/0035985 | A1 | 2/2007 | Fifield et al. |
| 2008/0049534 | A1 * | 2/2008 | Fifield et al. ................ 365/226 |
| 2008/0062749 | A1 * | 3/2008 | Fifield et al. ................ 365/154 |

OTHER PUBLICATIONS

Office action and rejections therein dated Mar. 12, 2007 of U.S. Appl. No. 11/161,742.
Office action and rejections therein dated Aug. 24, 2007 of U.S. Appl. No. 11/161,742.

* cited by examiner

*Primary Examiner*—Connie C Yoha
(74) *Attorney, Agent, or Firm*—Downs Rachlin Martin PLLC

(57) ABSTRACT

A design structure comprising a static random access memory (SRAM) (200, 400) comprising a plurality of SRAM cells (204), a plurality of wordlines (WL0-WLN) and a voltage regulator (240, 240', 300, 516) for driving the wordlines with a wordline voltage signal (VWLP). The wordline voltage signal is determined so as to reduce the likelihood of occurrence of read-disturbances and other memory instabilities. In one embodiment, the wordline voltage signal is determined as a function of the metastability voltage (VMETA) of the SRAM cells and an adjusted most positive down level voltage (VAMPDL) that is a function of a predetermined voltage margin (VM) and a most positive down level voltage (VMPDL) that corresponds to the read-disturb voltage of the SRAM cells.

3 Claims, 8 Drawing Sheets

VOLTAGE CONTROLLED STATIC RANDOM ACCESS MEMORY

FIELD OF THE INVENTION

The present invention generally relates to the field of design structures for designing and manufacturing integrated circuits. More particularly, the present invention is directed to a design structure comprising a voltage controlled static random access memory.

BACKGROUND OF THE INVENTION

Static random access memory (SRAM) is a common type of random access memory used aboard integrated circuit chips. SRAM is used in many applications, including cache memory for general purpose microprocessors, on-board memory for system-on-chip devices and on-board memory for application specific integrated circuits, among others. For many years the design of individual SRAM cells, e.g., four device and six device cells, has included the concept of designing the output device(s) and pull-down device(s) within each cell so that they satisfy a predetermined beta ratio constraint. As is well known in the art, for a transistor $\beta=\gamma$ (W/L), where $\gamma$ is the transconductance and W and L are, respectively, the width and length of the transistor channel. Conventionally, SRAM designers strive to keep the ratio between the $\beta$ value of each output device and the $\beta$ value of the corresponding pull-down device, i.e., beta ratio, between about 1.5 and about 2.0. Experience with SRAM made using current- and previous-generation integration scales and operating voltages has shown that limiting the beta ratio in this manner generally results in stable SRAM cell, i.e., an SRAM cell that is resistant to read disturbances and other types of instability.

Generally, satisfying the beta ratio constraint when designing SRAM cells made using current- and previous-generation integration scales has been sufficient. This is so because the geometric tracking between transistors within SRAM cells has been adequate, specifically, the widths and lengths of the diffusion source/drain regions have been adequately matched to provide good electrical stability and Vdd has been high enough (typically 1.5V or more) to provide sufficient overdrive to compensate for minor geometrical imbalances. However, in the next generation and follow-on generations of integration scale and operating voltages, future SRAM will generally be less tolerant to manufacturing limitations that tend to cause read disturbances and other instabilities.

This is particularly true at the present time when conventional photolithography techniques are being stretched to their limits in order to produce ever smaller feature sizes. For example, FIG. 1A shows an as-designed output transistor 10 and corresponding pull-down transistor 14 as they should appear in an integrated circuit. The pair of transistors 10, 14 includes three diffusion source/drain regions 18A-C and corresponding respective gates 22, 26. It is readily seen in FIG. 1A that diffusion source/drain regions 18A-B on either sides of gate 22 have a width 30 that is approximately one-half the width 34 of diffusion source/drain regions 18B-C on either side of gate 26. Correspondingly, note the well-defined notch 38 that is formed in diffusion source/drain region 18B between gates 22, 26. In addition, note the locations of notch 38, which is precisely centered between gates 22, 26. The difference in widths 30, 34 contributes to the beta ratio being a value other than 1, in this case about 2.0, in order to satisfy the conventional beta ratio constraint discussed above. In the present example, it is noted that width 34 is about twice width 30 yielding a beta ratio of about 2.0. This is so because the lengths of the diffusion source/drain regions 18A-C are identical and gates 22, 26 are precisely centered between the corresponding respective diffusion source/drain regions. It is noted that in other examples the lengths of diffusion source/drain regions 18A-C beneath the respective gates 22, 26 could also, or alternatively, be different so as to affect the beta ratio.

In contrast, FIG. 1B illustrates output and pull-down transistors 10', 14' as manufactured using conventional photolithography techniques. In comparing and contrasting FIGS. 1A and 1B, it is readily seen in FIG. 1B that the as-manufactured transistors 10', 14' include a number of deviations from as-designed transistors 10, 14 of FIG. 1A. These deviations are due to physical limitations of various steps of the manufacturing process, such as imprecision in the creation of the photolithography masks, imprecision in the deposition and etching steps, and imprecision in mask alignment, and undesirable effects of the behavior of light and diffusion particles as they pass through the openings in the masks. For example, as-manufactured "notch" 38' of FIG. 1B is blurred and much less distinct than as-designed notch 38 of FIG. 1A. In addition, as-manufactured gates 22', 26' and diffusion source/drain regions 18A'-C' of FIG. 1B do not have the sharp corners of the corresponding as-designed gates 22, 26 and diffusion source/drain regions 18A-C of FIG. 1A. Nor are as-manufactured gates 22', 26' of FIG. 1B located as precisely relative to diffusion source/drain regions 18A'-C' as as-designed gates 30, 34 of FIG. 1A are located relative to diffusion source/drain regions 18A-C.

Due to the various manufacturing limitations, as-manufactured devices, such as as-manufactured devices 10', 14' of FIG. 1B, deviate from as-designed devices, such as as-designed devices 10, 14 of FIG. 1A, in their physical dimensions and locations, which translates into deviations in operating characteristics. Relative to the beta ratio constraint discussed above, deviations of the as-manufactured channel widths and lengths will cause the $\beta$ values for the manufactured devices to deviate from their as-designed values. Under present manufacturing trends, as feature sizes become smaller, the magnitudes of the $\beta$ value deviations will increase, and the deviations themselves will be more influenced by the manufacturing limitations. This greater influence of manufacturing limitations will result in more unpredictability in terms of SRAM stability and, consequently, more conservative SRAM designs that will likely lag optimal designs of other integrated circuitry, such as logic circuitry.

Compounding the larger magnitudes and variability of $\beta$-value deviations is the fact that SRAM operating voltages will continue to decrease with increasing integration scale and corresponding decreasing feature sizes. As mentioned above, in conventional SRAM, the SRAM driving voltages are typically 1.5V and greater, and the corresponding transistor threshold voltage (Vt) is on the order of 300 mV. Consequently, there is much headroom for overdriving conventional devices with a 1.5V Vdd in order to overcome deviations in the as-manufactured $\beta$ values resulting from manufacturing limitations. However, in the next generation of SRAM, operating voltages will likely be on the order of 1V or less and the threshold voltage will likely be on the order of, e.g., 200 mV, leaving much less headroom for providing device overdrive. Consequently, what is needed is SRAM having stability that is relatively highly predictable regardless of feature size, technology used to manufacture the SRAM and operating voltage.

SUMMARY OF THE INVENTION

In one aspect, the present invention is directed to a design structure for an integrated circuit comprising a static random access memory (SRAM) that includes wordline circuitry and is powered by an SRAM voltage signal having a first voltage. At least one wordline voltage regulator is operatively configured to drive the wordline circuitry with a wordline voltage signal having a second voltage lower than the first voltage.

In another aspect, the present invention is directed to an integrated circuit chip comprising a static random access memory (SRAM) that includes a plurality of wordlines driven by a wordline voltage signal having a voltage. Voltage regulation circuitry is operatively configured to generate the wordline voltage signal. The voltage regulation circuitry includes a feedback loop that utilizes the wordline voltage signal in determining said voltage.

In yet another aspect, the present invention is directed to an integrated circuit chip comprising a static random access memory (SRAM) that includes a plurality of wordlines. Wordline driving circuitry is in electrical communication with the plurality of wordlines and is operatively configured to be switchable between at least a first wordline voltage signal and a second wordline voltage signal that is different from said first wordline voltage signal.

In a further aspect, the present invention is directed to a method of driving a wordline of a static random access memory (SRAM) comprising at least one SRAM cell. The method comprises the steps of determining a metastability voltage of the at least one SRAM cell and generating a wordline voltage signal as a function of the metastability voltage.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE DRAWINGS

Figure 1A:
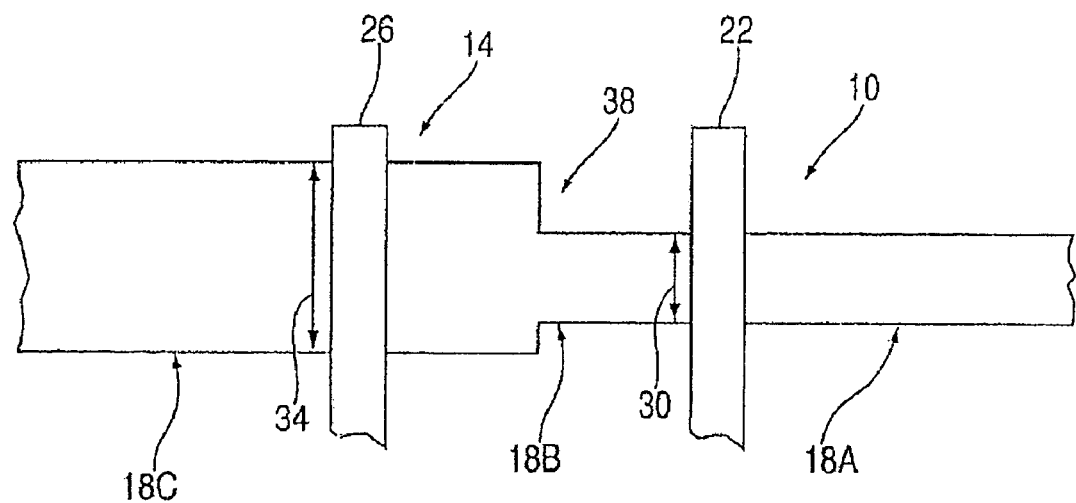
FIG. 1A is a plan view of an I/O transistor and a corresponding pull-down transistor as designed to have a beta ratio of approximately 2.0 in accordance with conventional design practice.
Figure 1B:
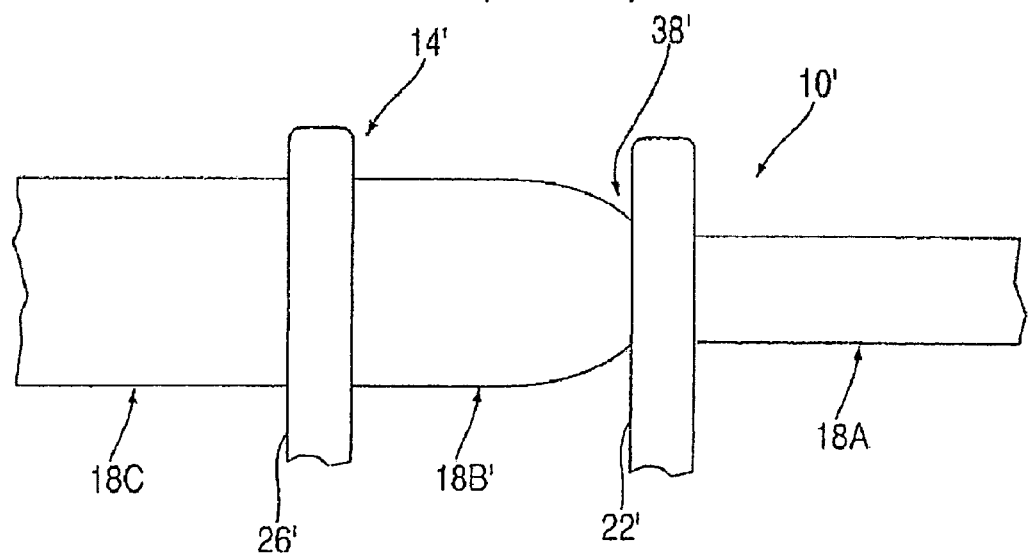
FIG. 1B is a plan view of the I/O transistor and pull-down transistor of FIG. 1A as manufactured, showing deviations in physical dimensions and component location caused by manufacturing limitations.
Figure 2A:
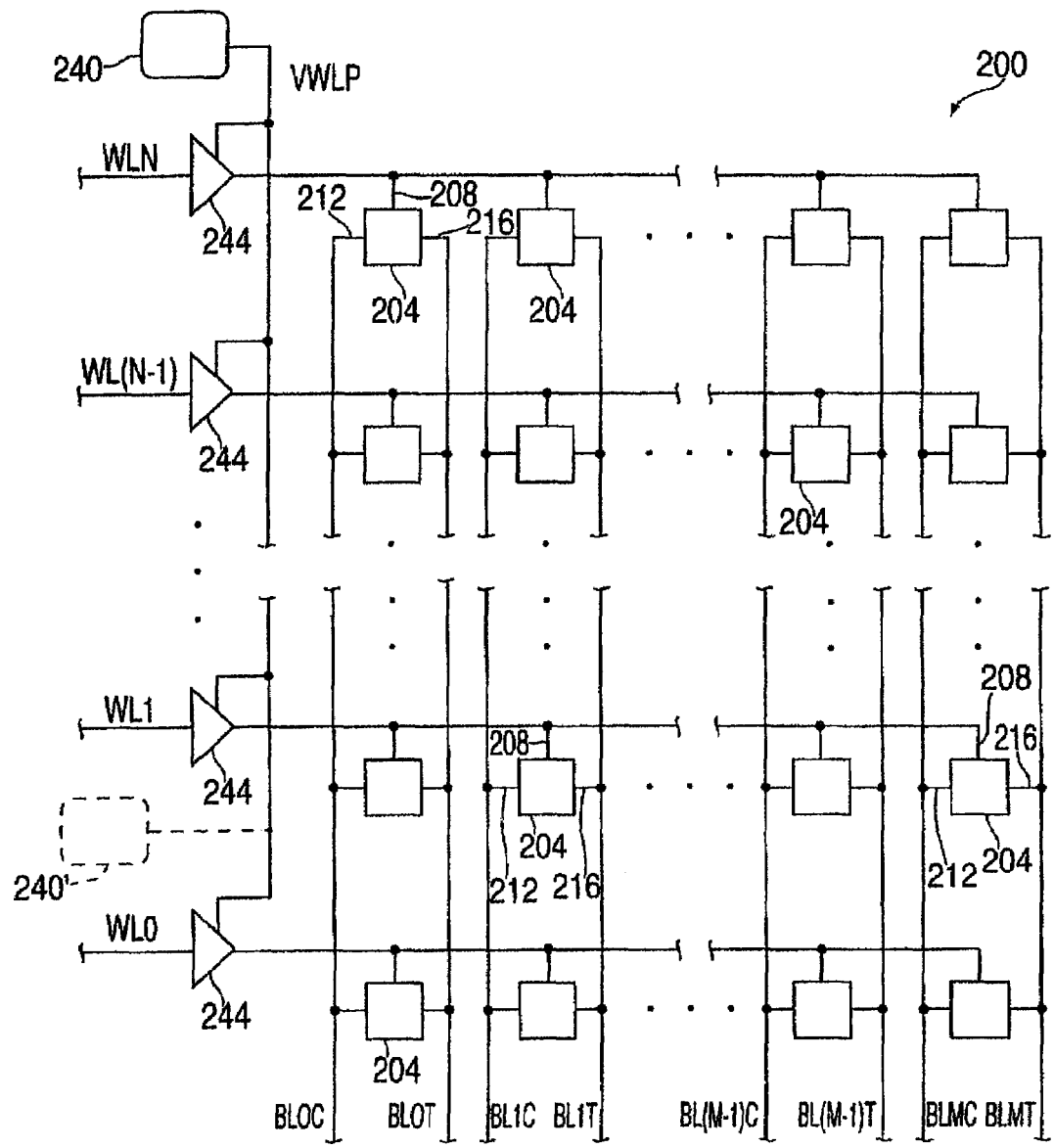
FIG. 2A is a high-level schematic diagram of a static random access memory (SRAM) of the present invention.
Figure 2B:
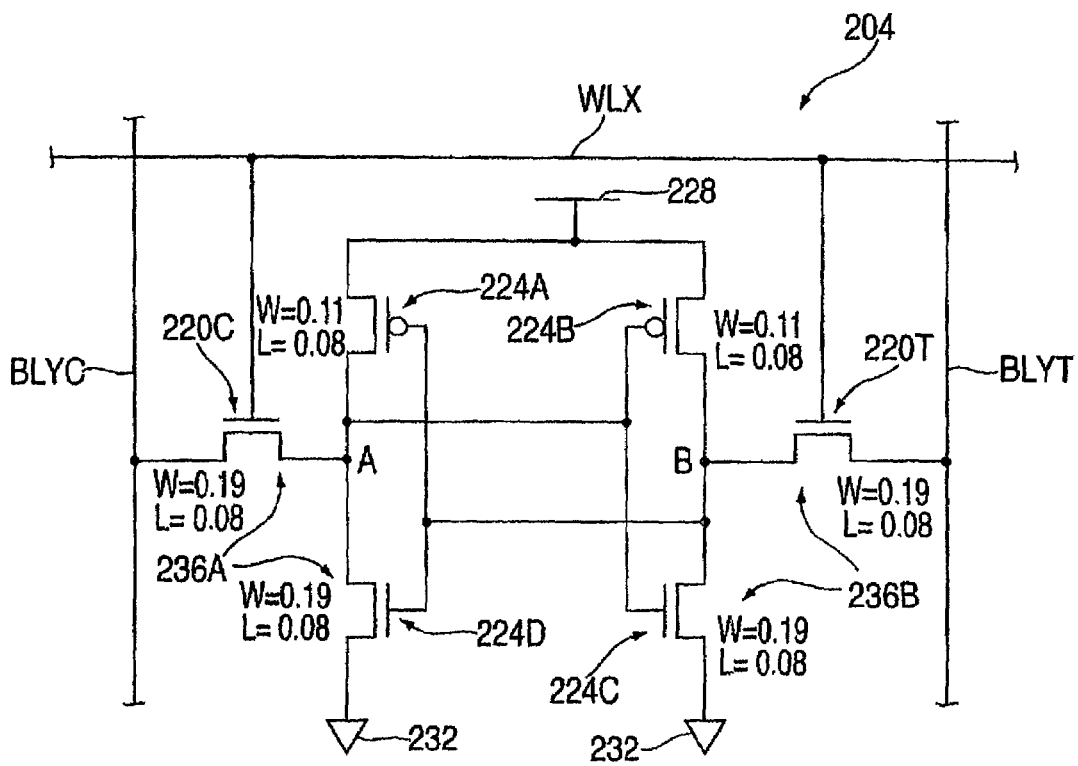
FIG. 2B is a schematic diagram of a six-device SRAM cell suitable for use in SRAM of FIG. 2A.

Referring now to the drawings, FIG. 2A illustrates in accordance with the present invention a static random access memory (SRAM), which is indicated generally by the numeral 200. SRAM 200 includes a plurality of SRAM cells 204 electrically connected with corresponding respective wordlines WL0-WLN and corresponding respective bit lines BL0C-BLMC and BL0T-BLMT via corresponding respective interconnects 208, 212, 216. FIG. 2B illustrates each SRAM cell 204 as being a six-device cell that generally includes two input/output (I/O) devices (transistors 220C, 220T) in electrical communication with wordline WLX and corresponding respective ones of bit lines BLYC and BLYT and four latching devices (transistors 224A-D) cross-coupled between the I/O devices and electrically connected to power and ground networks 228, 232. Each of I/O transistors 220C, 220T is electrically connected to a respective internal voltage node A, B located between a corresponding respective pair of latching transistors (224A-D). It is readily seen that SRAM cell 204 includes two pairs 236A-B of transistors that are electrically coupled such that the voltage across one transistor (either I/O transistor 220C, 220T) is pulled down by a corresponding respective one of latching transistors 224C, 224D. It is noted that while each SRAM cell 204 is shown as being a six-device cell, it may indeed comprise fewer or more devices as those skilled in the art will appreciate. In addition, while it is anticipated that the devices of SRAM cell will likely most often be field-effect transistors, these devices may alternatively be bipolar transistors or other devices providing a transistor function.

Preferably, but not necessarily, each pair 236A-B of I/O transistor (220C, 220T) and corresponding pull-down transistor (224C-D) is designed so as to minimize the impact that the limitations of the manufacturing techniques may have on the operating characteristic of the as-manufactured SRAM cells. For example, each pair 236A-B of corresponding respective I/O transistors 220C, 220T and pull-down transistors 224C-D may have as-designed diffusion regions (not shown) having identical width W and length L dimensions, as illustrated in FIG. 2B by each of transistors 220C, 224D, 220T, 224C having a width W=0.19 μm and a length L=0.08 μm. Making the widths W and lengths L of the diffusion regions of these transistors 220C, 224D, 220T, 224C equal to one another reduces the effect that manufacturing imprecision and variability has on the as-manufactured operating characteristics relative to the as-designed operating characteristics. Those skilled in the art will readily appreciate, however, that in other embodiments, widths W and lengths L need not be identical.

As discussed in detail in the Background section above, conventional SRAM designs rely on satisfying a constraint on the ratio of the β values of I/O devices (transistors) and corresponding respective pull-down devices (transistors) to inhibit cell instabilities, such as read disturbances. However, as also discussed in the Background section, the sheer smallness of the devices coupled with limitations of manufacturing techniques and reduced wordline voltages (typically Vdd) will likely make the conventional beta ratio constraint obsolete in terms of its ability to predict the stability of as-manufactured memory cells of next- and future-generation SRAM.

Consequently, SRAM 200 of FIG. 2A generally includes a voltage regulator 240 that drives each wordline WL0-WLN with a wordline voltage signal VWLP at a voltage other than Vdd (or other conventional wordline driving voltage signal) that is determined so as to inhibit instability in each memory cell 204 during a read cycle of that cell. As discussed below, voltage regulator 240 eliminates the need to satisfy any beta ratio constraints between I/O devices, such as I/O transistors 220C, 220T of FIG. 2B, and their corresponding respective pull-down devices, such as pull-down transistors 224C-D of FIG. 2B. Importantly, it will be seen that voltage regulator 240 can be designed so that wordline voltage signal VWLP is determined using as-manufactured devices so that the wordline voltage signal accounts for imprecision and variability in the manufacturing process.

Figure 3A:
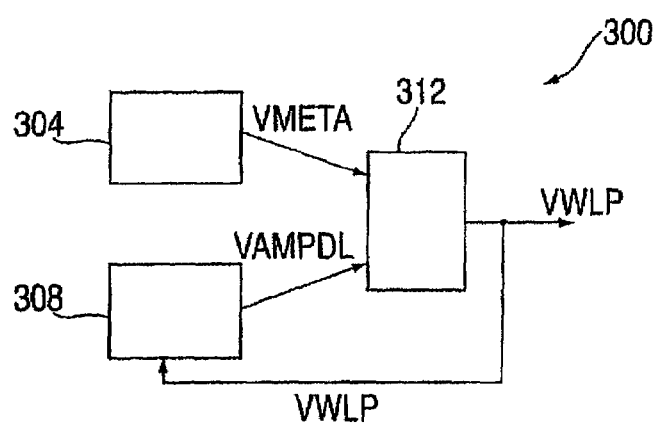
FIG. 3A is a high-level schematic diagram of a wordline voltage regulator suitable for use with the SRAM of FIG. 2A.
Figure 3B:
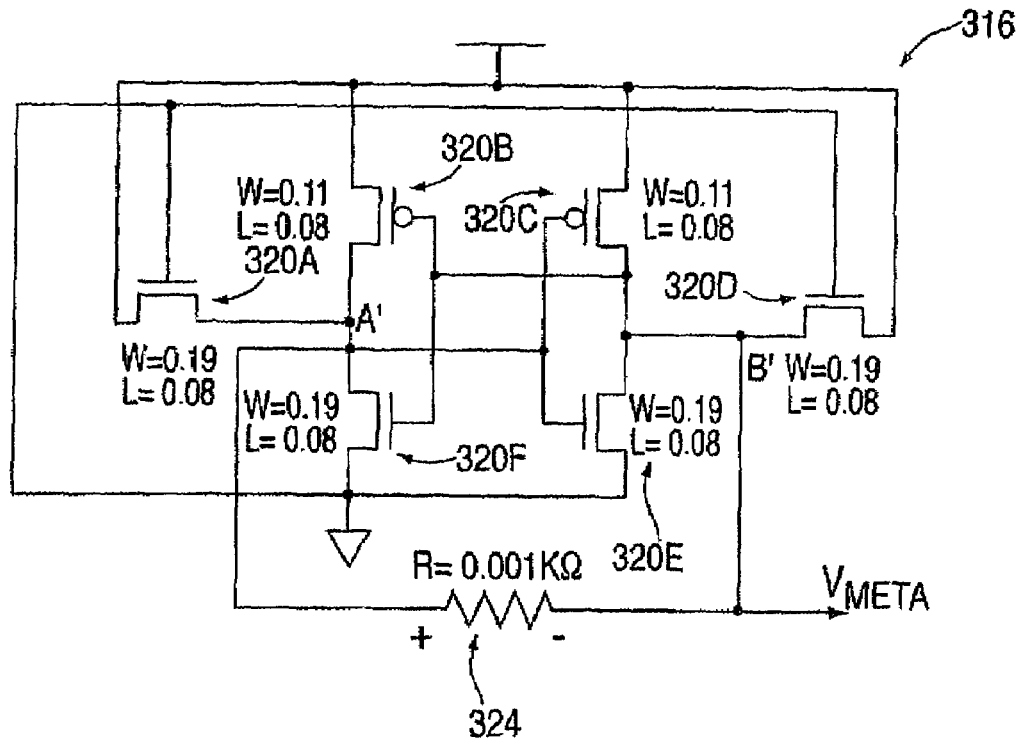
FIG. 3B is a schematic diagram of a metastability voltage generator suitable for use in the wordline voltage regulator of FIG. 3A.

FIG. 3A illustrates an exemplary voltage regulator 300 suitable for use as voltage regulator 240 of SRAM 200 of FIG. 2A. Voltage regulator 300 comprises a metastability voltage generator 304, a read-disturb voltage generator 308 and a wordline voltage calculator 312. Generally, metastability voltage generator 304 mimics an actual SRAM cell of the SRAM with which voltage regulator 300 will be used, e.g., SRAM cell 204 of FIG. 2B, and outputs a metastability voltage VMETA corresponding to the metastability voltage of the SRAM cell being mimicked. FIG. 3B illustrates a particular metastability voltage generator 316 that may be used for metastability voltage generator 304 of FIG. 3A when the SRAM cell mimicked is SRAM cell 204 of FIG. 2B.

Generally, metastability voltage generator 316 of FIG. 3B is similar to SRAM cell 204 of FIG. 2B in that it is a six-device cell that includes transistors 320A-F having the same diffusion region widths W and lengths L as transistors 220C, 220T, 224A-D of the SRAM cell of FIG. 2B. In the case of metastability voltage generator 316 of FIG. 3B, however, the two mirror-image sides of the six-device cell are electrically coupled by placing a resistor 324 between internal nodes A', B' (which correspond to internal nodes A, B of SRAM cell 204 of FIG. 2B), in this case a 1Ω resistor. Electrically coupling internal nodes A', B' of metastability voltage generator 316 in this manner causes the voltages at the internal nodes to be approximately equal to each other at their unity gain point, i.e., at the metastable operating point of the cell. Since the six-device cell of metastability voltage generator 316 mimics an actual SRAM cell, again in this case SRAM cell 204 of FIG. 2B, metastability voltage VMETA output by the metastability voltage generator corresponds to the metastability voltage of the mimicked SRAM cell, i.e., SRAM cell 204.

Figure 3C:
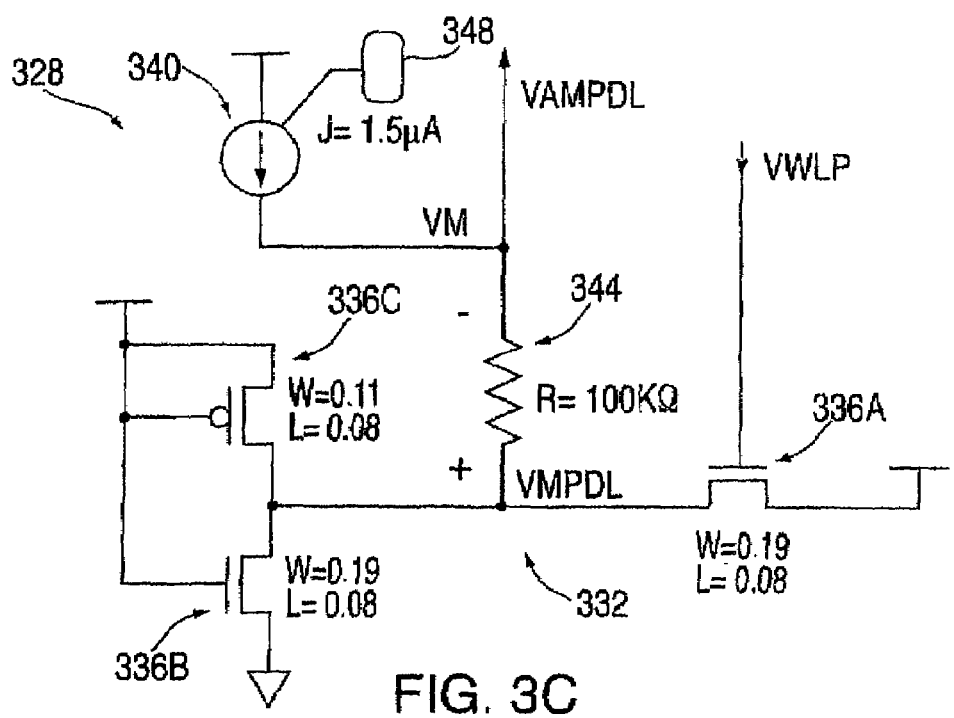
FIG. 3C is a schematic diagram of a read-disturb voltage generator suitable for use in wordline voltage regulator of FIG. 3A.

Referring again to FIG. 3A, read-disturb voltage generator 308 may generate a voltage (called "VAMPDL" herein for "adjusted most positive down level voltage") that is a function of the read-disturb level in an actual SRAM cell of the SRAM with which voltage regulator 300 will be used, such as SRAM cell 204 of FIG. 2B. Read-disturb voltage generator 308 of FIG. 3A may have as its input the wordline voltage VWLP output by voltage regulator 312. FIG. 3C shows an exemplary read-disturb voltage generator 328 suitable for use with SRAM cell 204 of FIG. 2B.

Generally, read-disturb voltage generator 328 of FIG. 3C may comprise one of the mirror-image sides of SRAM cell 204 of FIG. 2B, i.e., a one-half SRAM cell 332, such that it includes three transistors 336A-C corresponding, respectively, to I/O transistor 220T, pull-down transistor 224C and pull-up transistor 224B of SRAM cell 204 of FIG. 2B. It is noted that transistors 336A-C have the same widths W and lengths L as the corresponding respective transistors 220T, 224B-C of SRAM cell 204. In this manner, read-disturb voltage generator 328 generates voltage VAMPDL that is a function of the read-disturb voltage in the actual memory cells 204 of SRAM 200 of FIG. 2A. It is noted that in other embodiments read-disturb voltage generator 328 (FIG. 3A) may comprise an entire SRAM cell. However, the resulting circuitry required to provides the functionality needed is generally relatively much more complex. At the present time it is believed that one-half SRAM cell 332 (FIG. 3C) provide sufficient accuracy. That said, additional accuracy, if needed, may be achieved by implementing read-disturb voltage generator 328 using, e.g., a full SRAM cell, such as SRAM cell 204 (FIG. 2B). Those skilled in the art will understand how to implement read-disturb generator 328 using a full SRAM cell.

Read-disturb voltage generator 328 may also include a current source 340 coupled across a resistor 344 from one-half SRAM cell 332. In the present example, the resistance of resistor 344 is 100 kΩ. Current source 340 may be used to generate a voltage offset, or voltage margin VM, that is added to a most positive down level voltage VMPDL, which represents the read-disturb voltage of an actual SRAM cell, again in this case SRAM cell 204 of FIG. 2B, and that appears at the node between transistor 336A and the pair of transistors 336B-C. Voltage margin VM may be adjusted, e.g., by adjusting the current through resistor 344 using current source 340. As current from source 340 is increased, a larger IR drop builds on resistor 344, thereby increasing voltage margin VM. As discussed below in connection with voltage calculator 312 of FIG. 3A, an increase in voltage margin VM results in a lower wordline voltage VWLP. Control of current source 340 may be provided using a digital-to-analog converter (DAC) 348, which may utilize poly resistors (not shown). DAC 348 may be controlled, e.g., by registers, fuses or other control means (not shown) that are changed at wafer or module test or in the operating customer environment.

It is recognized that injecting current through resistor 344 using current source 340 impacts the value of most positive down level voltage VMPDL. However, based on present designs the level of disturbance of most positive down level voltage VMPDL using this technique is generally insignificant relative to the performance of the voltage regulator 300 (FIG. 3A) due to the relatively low current injected by current source 340. If in other designs most positive down level voltage VMPDL is impacted to the extent that the performance of voltage regulator is unacceptable, other means may be used to add voltage margin VM to most positive down level voltage VMPDL in order to generate adjusted most positive down level voltage AVMPDL. Examples of other means include creation of a voltage offset using op-amp adder circuits. Those skilled in the art will readily understand how to implement such alternative means.

Figure 3D:
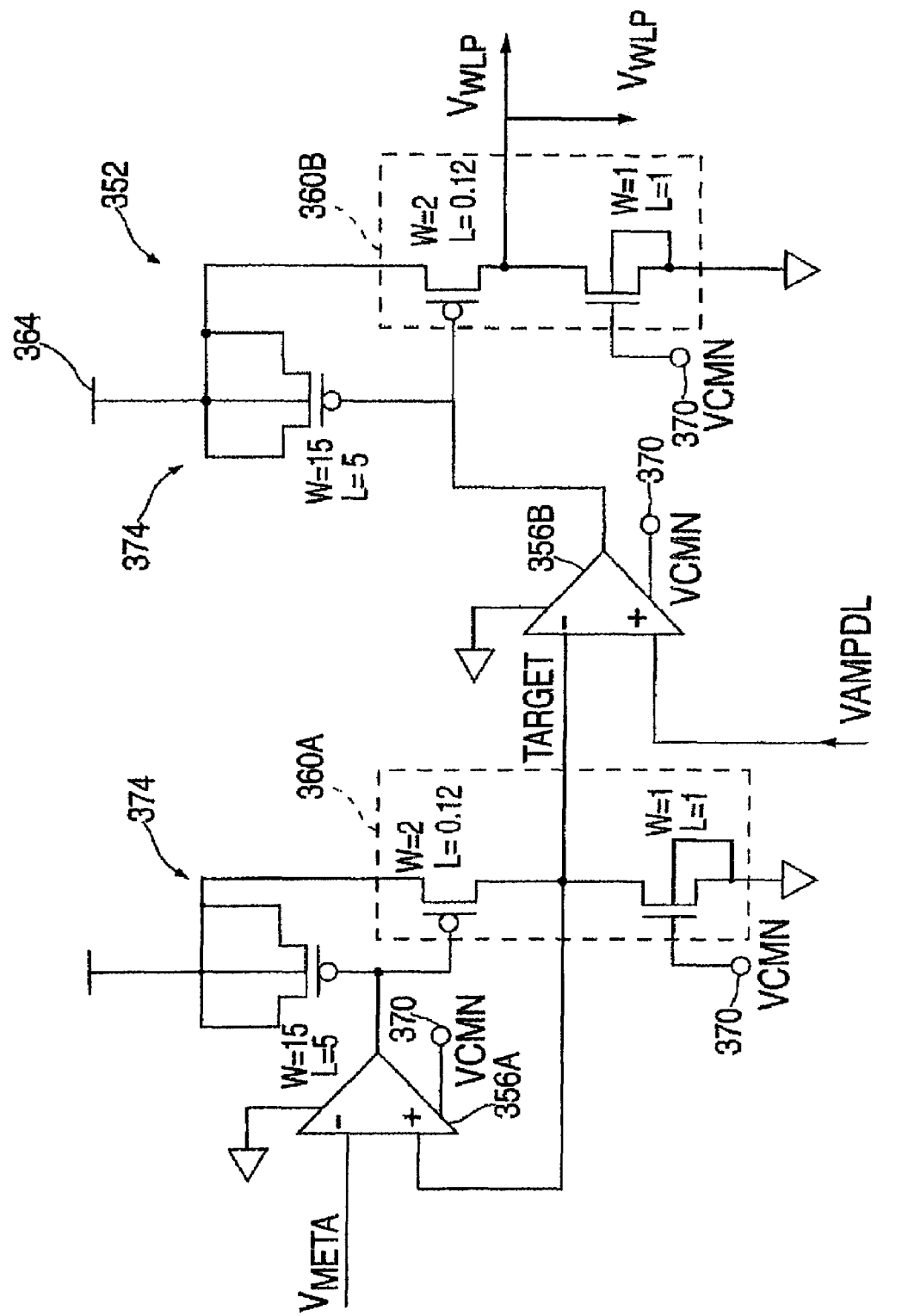
FIG. 3D is a schematic diagram of a wordline voltage calculator suitable for use in wordline voltage regulator of FIG. 3A.

Referring again to FIG. 3A, wordline voltage calculator 312 generally compares metastability voltage VMETA to adjusted most positive down level voltage VAMPDL so as to generate wordline control voltage VWLP. FIG. 3D illustrates an exemplary wordline voltage calculator 352 suitable for use as voltage calculator 312 of FIG. 3A in connection with SRAM cell 204 of FIG. 2B.

Voltage calculator 352 may comprise first and second operational amplifiers (op-amps) 356A-B and first and second gain stages 360A-B. First op-amp 356A and first gain stage 360A output a target voltage TARGET, which is an average of metastability voltage VMETA from metastability voltage generator 316 of FIG. 3B. Second op-amp 356B compares target voltage TARGET to adjusted most positive down level voltage VAMPDL from read-disturb voltage generator 324 of FIG. 3C and outputs the results to second gain stage 360B, which is powered by a voltage rail 364. Voltage rail 364 provides a voltage across second gain stage 360B that is substantially the same as the voltage, e.g., Vdd, provided to the bit lines (not shown) of the SRAM that receives wordline voltage signal VWLP, e.g., SRAM of FIG. 2A. Indeed, voltage rail 364 may be part of the same power network that powers the SRAM. Wordline voltage VWLP output from wordline voltage calculator 312 is provided to the wordlines of an SRAM, e.g., SRAM 200 of FIG. 2A, in any suitable manner, e.g., using buffers 244 (FIG. 2A) for wordline drivers (not shown).

Referring to FIG. 2A, it is noted that SRAM 200 may include only one voltage regulator 240 for the entire SRAM as shown or, alternatively, the SRAM may include multiple voltage regulators, e.g., voltage regulators 240, 240', for driving fewer than all wordlines in the memory array. It is noted that in wordline voltage calculator 352 of FIG. 3D, each of first and second op-amps 356A-B and first and second gain stages 360A-B are each in electrical communication with a voltage source 370 that provides a current source control level used to operate the current mirrors of op-amps 356A-B and gain stages 360A-B. Voltage source 370 is at a voltage VCMN that may be derived from a bandgap circuit. Capacitors 374A-B are decoupling capacitors that provide phase margin in a manner well known in the art.

As an example, the various voltages generated and output by voltage regulator 300 (FIG. 3A) in an exemplary case wherein the voltage regulator comprises metastability voltage generator 316 (FIG. 3B), read-disturb voltage generator 328 (FIG. 3C) and wordline voltage calculator 352 (FIG. 3D) and the voltage on voltage rail 364 is Vdd=1V are as follows. Metastability voltage VMETA output by metastability voltage generator 316 of FIG. 3B is about 0.5V, as is target voltage TARGET (FIG. 3D) output by first gain stage 360A. At steady state, most positive down level voltage VMPDL (FIG. 3C) is about 0.35V and voltage margin VM is about 0.15V, which yields an adjusted most positive down level voltage VAMPDL (FIGS. 3C and 3D), i.e., sum of VMPDL and VM, of about 0.5V, such that at steady state VMETA≅VAMPDL≅0.5V. In this case, wordline voltage VWLP is about 0.8V.

Figure 4:
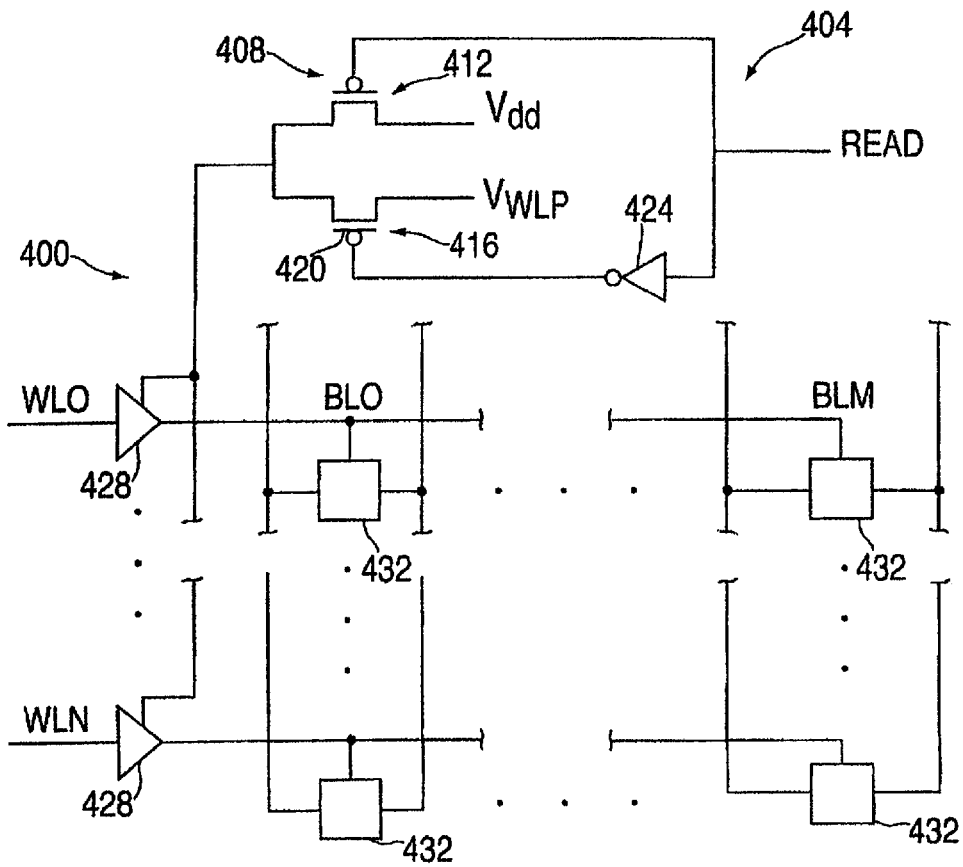
FIG. 4 is a schematic diagram of an alternative SRAM of the present invention having a switchable wordline voltage.

FIG. 4 illustrates an SRAM 400 of the present invention that includes wordline driving circuitry 404 that provides one of two different wordline driving voltage signals depending on whether or not any wordline WL0-WLN is in a read state. In the embodiment shown, the two wordline voltage signals are Vdd (or other non-read voltage signal) and VWLP, which may be a value less than the corresponding value of Vdd. Voltage signal VWLP may come from, e.g., voltage regulator 240 of FIG. 2A, voltage regulator 300 of FIG. 3A, any other voltage regulator made in accordance with the present invention or other voltage source. In the embodiment shown, each of voltage signals Vdd and VWLP is input into a de-multiplexer 408 that outputs either voltage signal Vdd or voltage signal VWLP based on the value of a read signal READ. In the embodiment shown, de-multiplexer 408 includes a first p-type field effect transistor (pFET) 412 for switching voltage signal Vdd and a second pFET 416 for switching voltage signal VWLP.

First and second pFETs 412, 416 are switched by read signal READ. However, the input to gate 420 of second pFET 416 includes an inverter 424 that flips the state of read signal READ. Consequently, when any wordline WL0-WLN is placed into a read state when a read instability becomes an issue such that read signal READ is activated, de-multiplexer 408 provides each wordline buffer 428 with voltage signal VWLP, which as discussed above relative to FIGS. 2A-B and 3A-D, is determined so as to minimize the likelihood that a read-disturbance or other instability will occur in the corresponding one(s) of memory cells 432. Conversely, when SRAM 400 is not in a read state, i.e., when a read disturbance or other read instability does not occur, de-multiplexer 408 provides each wordline buffer 428 with the full Vdd. Although wordline driving circuitry 404 is shown as including de-multiplexer 408 for selecting between two voltage signals Vdd, VWLP, those skilled in the art will readily understand how to implement the selection with other devices.

Figure 5:
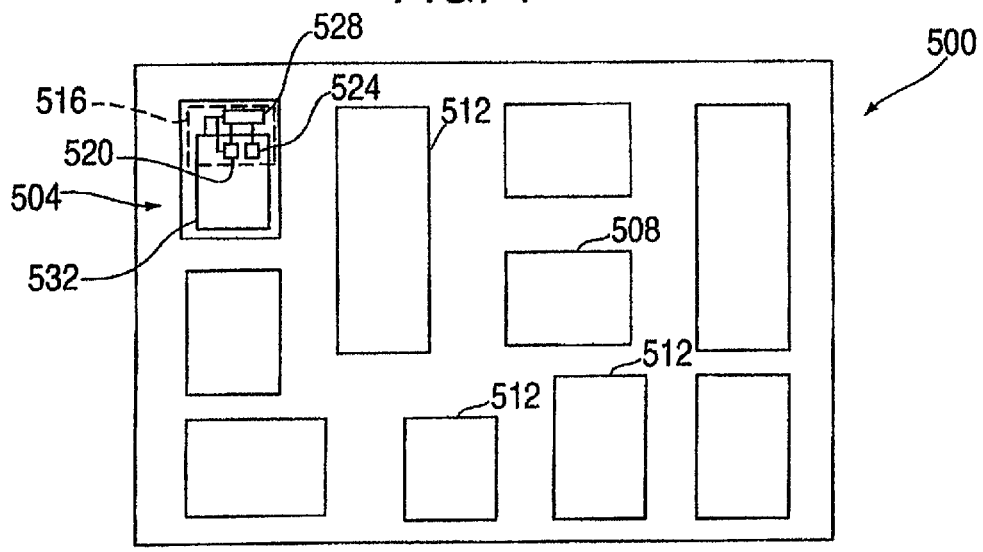
FIG. 5 is a high-level schematic diagram of an integrated circuit chip of the present invention.

FIG. 5 illustrates an integrated circuit chip 500 of the present invention. Chip 500 may generally include one or more SRAMs 504, 508 made in accordance with the foregoing disclosure. For example, SRAM 504 may be similar to SRAM 200 of FIG. 2A and SRAM 508 may be similar to SRAM 400 of FIG. 4. Of course, chip 500 of FIG. 5 may also contain any of a number of type of functional circuitry blocks 512 that will depend upon the design of the chip and type of function(s) that the chip performs. Examples of functional circuitry blocks other than SRAM include chip-level I/O blocks, logic blocks, arithmetic logic units, embedded dynamic random access memories (EDRAMs) and digital signal processing devices, among others. In this connection, chip 500 may be any of a variety of types including, an SRAM chip, a general-purpose microprocessor chip, an application specific integrated circuit chip and a system-on-chip chip, among others.

As mentioned above in connection with SRAM 200 of FIG. 2A, a feature of the present invention is that it permits the determination of a wordline voltage signal as a function of as-manufactured devices, e.g., transistors 320A-F (FIG. 3B), 332A-C (FIG. 3C) that mimic the corresponding transistors 220C, 220T, 224A-D (FIG. 2B) of actual memory cells 204 (FIGS. 2A, 2B). In this manner, the actual wordline voltage VWLP determined and utilized accounts for any variations in the as-manufactured devices relative to the as-designed devices due to manufacturing limitations. While the mimicking devices, and corresponding metastability voltage generator (304, 316) and read-disturb voltage generator (308, 324) may be placed virtually anywhere aboard a chip, die or even wafer, it may be advantageous to embed these devices within the SRAM, or portion thereof, that will be powered by the determined wordline voltage signal VWLP.

For example, FIG. 5 illustrates SRAM 504 as including a voltage regulator 516 of the present invention that includes a metastability voltage generator 520, read-disturb voltage generator 524 and a wordline voltage calculator 528 that may be similar to the corresponding components of voltage regulator 300 of FIG. 3A. In the embodiment shown in FIG. 5, both metastability voltage generator 520 and read-disturb voltage generator 524 are located within a memory array 532 of memory cells (not shown) that form a large part of SRAM 504. By locating metastability voltage generator 520 and read-disturb voltage generator 524 among actual memory cells within memory array 532, the mimicking devices of these components are subject to substantially the same manufacturing conditions as the devices of the actual memory cells. Consequently, the as-manufactured mimicking devices will be relatively very close to the actual memory cell devices in terms of physical dimensions and, consequently, operating characteristics. The result is that wordline voltage calculator 528 can determine a wordline voltage signal that is most suitable for the as-manufactured memory cells.

Figure 6:
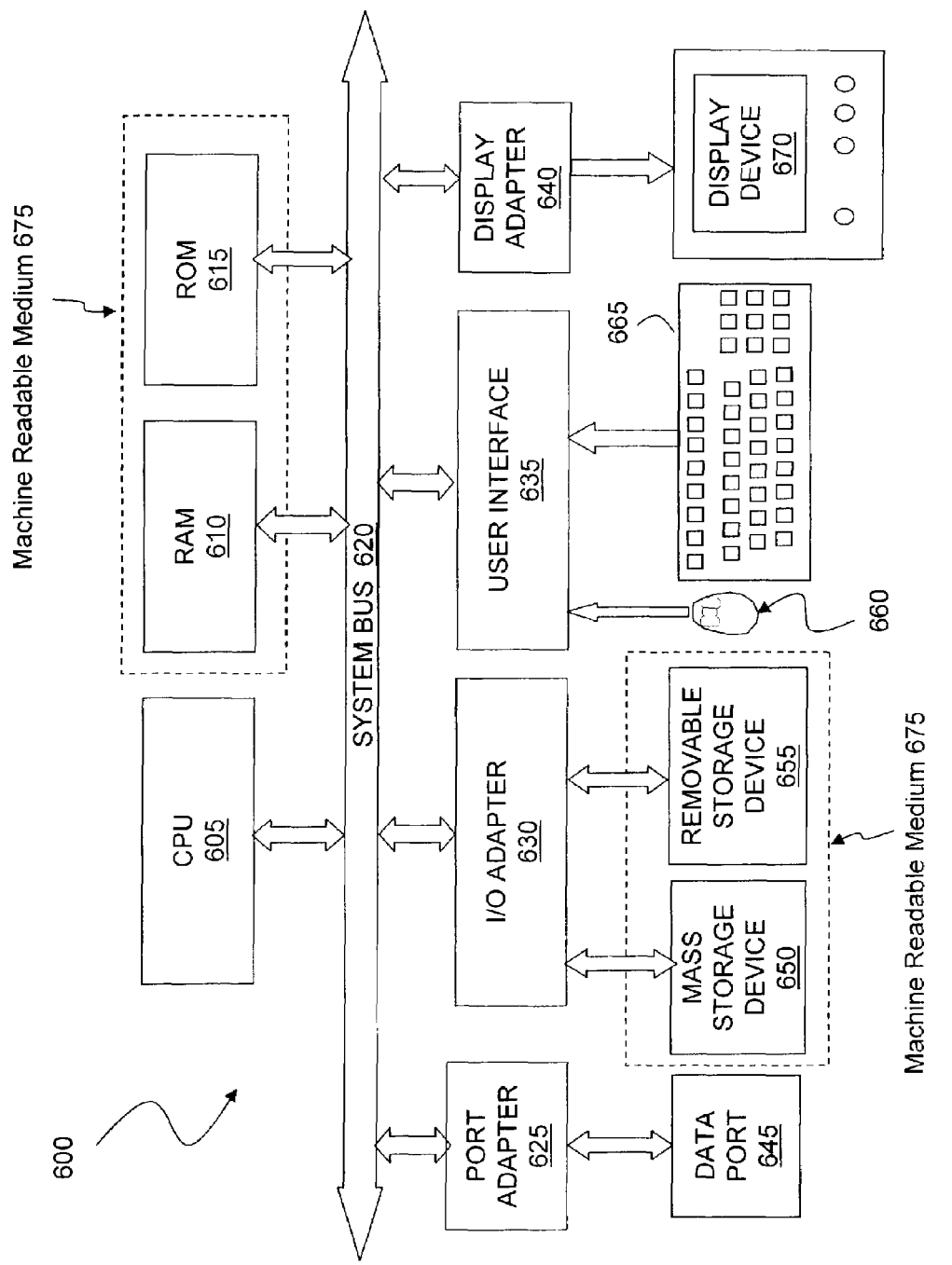
FIG. 6 is an example computer system of a general-purpose computer system and computer readable medium for practicing the present invention.

FIG. 6 illustrates a block diagram of a general-purpose computer system which can be used to implement the system and method described herein. The system and method may be coded as a set of instructions on removable or hard media for use by general-purpose computer. FIG. 6 is a schematic block diagram of a general-purpose computer for practicing the present invention and includes computer system 600, which has at least one microprocessor or central processing unit (CPU) 605. CPU 605 is interconnected via a system bus 620 to machine readable media 675, which includes, for example, a random access memory (RAM) 610, a read-only memory (ROM) 615, a removable and/or program storage device 655 and a mass data and/or program storage device 650. An input/output (I/O) adapter 630 connects mass storage device 650 and removable storage device 655 to system bus 620. A user interface 635 connects a keyboard 665 and a mouse 660 to system bus 620, and a port adapter 625 connects a data port 645 to system bus 620 and a display adapter 640 connect a display device 670. ROM 615 contains the basic operating system for computer system 600. Examples of removable data and/or program storage device 655 include magnetic media such as floppy drives, tape drives, portable flash drives, zip drives, and optical media such as CD ROM or DVD drives. Examples of mass data and/or program storage device 650 include hard disk drives and non-volatile memory such as flash memory. In addition to keyboard 665 and mouse 660, other user input devices such as trackballs, writing tablets, pressure pads, microphones, light pens and position-sensing screen displays may be connected to user interface 635. Examples of display device 670 include cathode-ray tubes (CRT) and liquid crystal displays (LCD).

A machine readable computer program may be created by one of skill in the art and stored in computer system 600 or a data and/or any one or more of machine readable medium 675 to simplify the practicing of this invention. In operation, information for the computer program created to run the present invention is loaded on the appropriate removable data and/or program storage device 655, fed through data port 645 or entered using keyboard 665. A user controls the program by manipulating functions performed by the computer program and providing other data inputs via any of the above mentioned data input means. Display device 670 provides a means for the user to accurately control the computer program and perform the desired tasks described herein.

Figure 7:
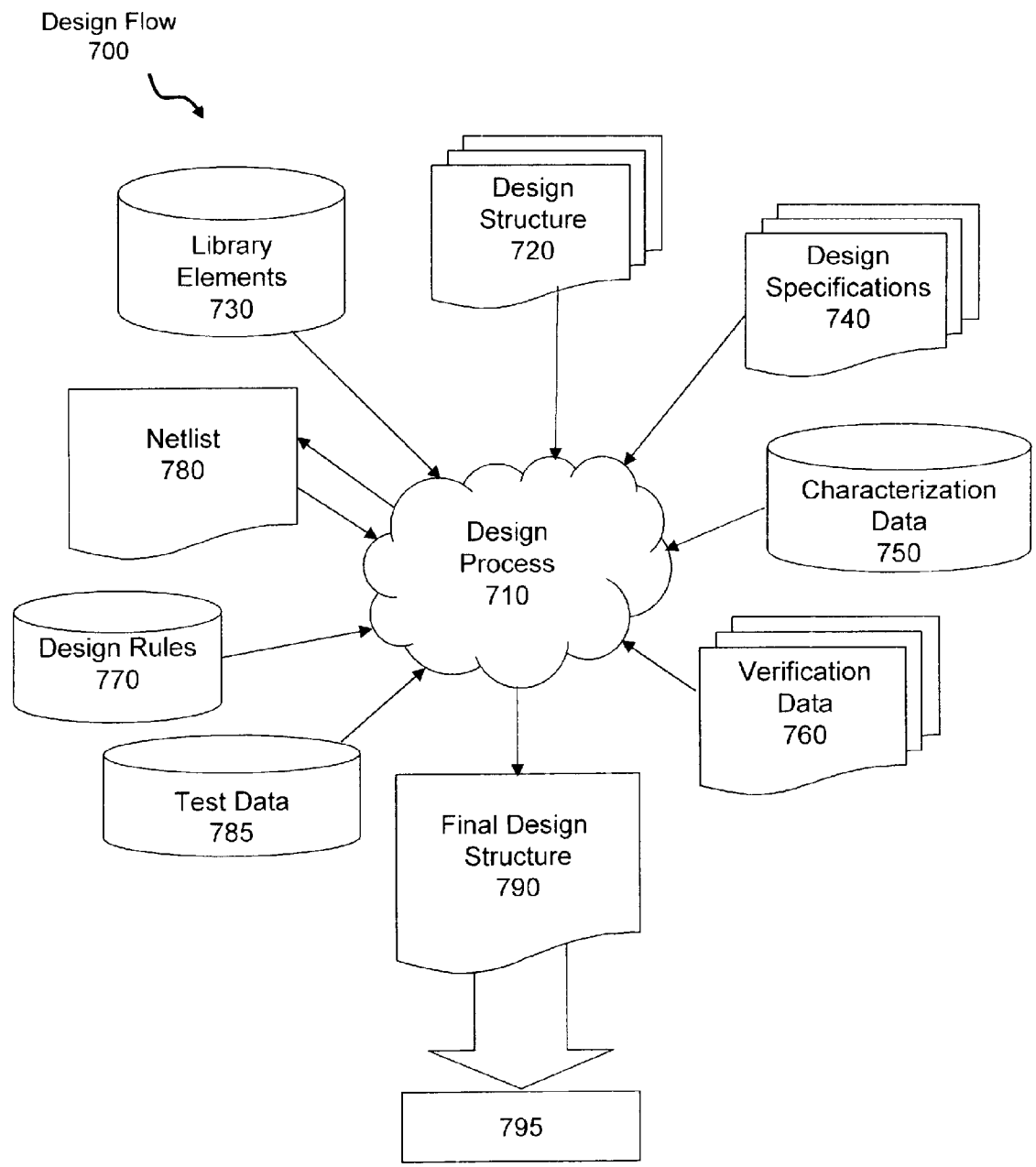
FIG. 7 is an example design flow process of instantiating a design structure comprising an embodiment of the present invention into an IC design to create a final design structure.

FIG. 7 shows a block diagram of an example design flow 700. Design flow 700 may vary depending on the type of IC being designed. For example, a design flow 700 for building an application specific IC (ASIC) will differ from a design flow 700 for designing a standard component. Design structure 720 is an input to a design process 710 and may come from an IP provider, a core developer, or other design company. Design structure 720 comprises SRAM 200 and/or 400 in the form of schematics or HDL, a hardware-description language, (e.g., Verilog, VHDL, C, etc.). Design structure 720 may be on one or more of machine readable medium 675 as shown in FIG. 6. For example, design structure 720 may be a text file or a graphical representation of SRAM 200 and/or 400. Design process 710 synthesizes (or translates) SRAM 200 and/or 400 into a netlist 780, where netlist 780 is, for example, a list of transistors, subarrays, macros, etc. and describes the connections to other elements and circuits in an integrated circuit design and recorded on at least one of machine readable medium 675.

Design process 710 includes using a variety of inputs; for example, inputs from library elements 730 which may house a set of commonly used elements, circuits, and devices, including models, layouts, and symbolic representations, for a given manufacturing technology (e.g. different technology nodes, 32 nm, 45 nm, 90 nm, etc.), design specifications 740, characterization data 750, verification data 760, design rules 770, and test data files 785, which may include test patterns and other testing information. Design process 710 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 710 without deviating from the scope and spirit of the invention.

Ultimately design process 710 translates SRAM 200 and/or 400, along with the rest of the integrated circuit design (if applicable), into a final design structure 790 (e.g., information stored in a GDS storage medium). Final design structure 790 may comprise information such as, for example, test data files, design content files, manufacturing data, layout parameters, wires, levels of metal, vias, shapes, test data, data for routing through the manufacturing line, and any other data required by a semiconductor manufacturer to produce SRAM 200, and/or 400. Final design structure 790 may then proceed to a stage 795 of design flow 700; where stage 795 is, for example, where final design structure 790: proceeds to tape-out, is released to manufacturing, is sent to another design house or is sent back to the customer.

Although the invention has been described and illustrated with respect to exemplary embodiments thereof, it should be understood by those skilled in the art that the foregoing and various other changes, omissions and additions may be made therein and thereto, without parting from the spirit and scope of the present invention.

What is claimed is:

1. A design structure instantiated in a machine readable medium for designing, manufacturing, or testing an integrated circuit, the design structure comprising:
    a static random access memory (SRAM) that includes wordline circuitry and is powered by an SRAM voltage signal having a first voltage; and
    at least one wordline voltage regulator operatively configured to drive said wordline circuitry with a wordline voltage signal having a second voltage lower than the first voltage;
    wherein said SRAM is susceptible to read disturbances and said second voltage is selected so as to inhibit said read disturbances; and
    wherein said at least one voltage regulator includes a metastability voltage generator, and said SRAM includes a plurality of SRAM cells each having a pair of internal voltage nodes and said metastability voltage generator comprises one of said plurality of SRAM cells having said pair of internal voltage nodes electrically coupled to one another.

2. The design structure according to claim 1, wherein said at least one voltage regulator includes a read-disturb generator and said read-disturb voltage generator mimics at least one-half of each SRAM cell of said plurality of SRAM cells.

3. The design structure according to claim 1, wherein ones of said plurality of SRAM cells each have a metastability voltage, said at least one voltage regulator operatively configured to generate said second voltage as a function of said metastability voltage.

* * * * *